(12) United States Patent
Ciureanu et al.

(10) Patent No.: US 7,492,151 B2
(45) Date of Patent: Feb. 17, 2009

(54) MAGNETIC ANOMALY DETECTOR AND METHOD USING THE MICROWAVE GIANT MAGNETOIMPEDENCE EFFECT

(76) Inventors: Petru Ciureanu, Saint-Laurent (CA); Mariana Ciureanu, legal representative, 2850 Métivier, Ville St. Laurent, QC (CA) H4K 1J4; Piotr Rudkowski, 3 Blue Jays, Dollard-des-Ormeaux, Québec (CA) H9A 3H4; Arthur Yelon, 4700 de Maisonneauve W., Westmount, Québec (CA) H3Z 1M1; Morton Roseman, 11 Deanbank Drive, Thornhill, Ontario (CA) L3T 1X2

( * ) Notice: Subject to any disclaimer, the term of this patent is extended or adjusted under 35 U.S.C. 154(b) by 65 days.

(21) Appl. No.: 11/278,869

(22) Filed: Apr. 6, 2006

(65) Prior Publication Data

US 2007/0040551 A1    Feb. 22, 2007

Related U.S. Application Data

(60) Provisional application No. 60/668,594, filed on Apr. 6, 2005.

(51) Int. Cl.
*G01R 33/00* (2006.01)
*H01B 1/00* (2006.01)

(52) U.S. Cl. .................... 324/244; 174/68.1

(58) Field of Classification Search ............. 324/228, 324/244, 260, 331, 332, 337, 344; 174/68.1, 174/76 C, 88 C, 70 R, 71 C, 75 C
See application file for complete search history.

(56) References Cited

U.S. PATENT DOCUMENTS 5,389,875 A * 2/1995 Rosen et al. ............... 324/228

* cited by examiner

*Primary Examiner*—Bot LeDynh
(74) *Attorney, Agent, or Firm*—Baker & Daniels LLP

(57) ABSTRACT

A high sensitivity magnetic anomaly detector for geomagnetic exploration comprises a shorted coaxial transmission line having as central conductor an amorphous magnetic wire. A static magnetic field is applied along the transmission line. A transverse electromagnetic wave also propagates along the transmission line and excites a ferromagnetic resonance of the magnetic ions located within the depth of penetration of the circumferential microwave magnetic field into the magnetic wire. The microwave giant magnetoimpedance effect occurring in the magnetic wire changes the magnetic wire impedance as follows: the real part of the impedance peaks and the imaginary part passes through zero at a given frequency (the ferromagnetic resonance frequency). This frequency depends on the saturation magnetization of the magnetic wire and the strength of the static magnetic field. A slight variation of the Earth's magnetic field (a magnetic anomaly) changes this frequency, thus providing information about large metallic masses hidden under the Earth's surface or underwater.

18 Claims, 5 Drawing Sheets

MAGNETIC ANOMALY DETECTOR AND METHOD USING THE MICROWAVE GIANT MAGNETOIMPEDENCE EFFECT

CROSS REFERENCE TO RELATED APPLICATIONS

This application claims the benefit of U.S. Provisional Application No. 60/668,594 filed on Apr. 6, 2005 for an invention entitled "Magnetic Anomaly Detector Using the Microwave Giant Magnetoimpedence Effect", the content of which is incorporated herein by reference.

FIELD OF THE INVENTION

The present invention relates generally to detectors for use in geomagnetic exploration and more particularly, to a magnetic anomaly detector and method that make use of the microwave giant magnetoimpedence effect.

BACKGROUND OF THE INVENTION

The exploration of natural resources requires many different technologies, expertise and large high-risk capital investments to be successful. Geophysical exploration involves the search for deposits by measuring the physical properties of rocks, such as remnant magnetization, electrical conductivity, radioactivity and the behavior during seismic shocks. Gravity methods, such as gravity gradiometry and gravimetry, use variations in the gravitational field above the Earth's surface to infer variations in the subsurface density.

Geochemical exploration involves the study of varying elemental concentrations in natural features such as plants, soil, lakes, streams, swamps and gases. Leaching and weathering disperses the components of resource deposits into the surrounding water, soil, vegetation and air to create chemically enriched zones known as geochemical anomalies.

Geomagnetic exploration involves the study of variations in the Earth's magnetic field above the Earth's surface to infer variations in the subsurface metallic content, which may create zones of magnetic anomalies in the spatial distribution of the Earth's magnetic field. To measure such magnetic anomalies, a magnetic anomaly detector is typically employed. One common magnetic anomaly detector comprises an optically pumped cesium vapor magnetometer, which works in tandem with a triaxial magnetometer providing data necessary for precise mechanical guidance of the cesium head of the vapor magnetometer. This magnetic anomaly detector is typically placed on an aircraft and used during airborne surveys. An exemplary optically pumped cesium vapor magnetometer is set out in the AN/ASQ-508(V) System Description published by CAE, Inc., Canada, Mar. 22, 2002.

Solid-state magnetic anomaly detectors based on the giant magnetoimpedance (GMI) effect in ultra-soft magnetic conductors have also been considered. These magnetic anomaly detectors are advantageous in that they are simple, robust and inexpensive as compared to optically pumped cesium vapor magnetometers. The sensing element in such magnetic anomaly detectors is, in general, a wire made of an amorphous magnetic alloy with high magnetic permeability, saturation magnetization and electrical resistivity, and very low coercivity and transverse anisotropy field. The impedance of the magnetic wire changes significantly with the strength of an applied static magnetic field, which modifies the circumferential permeability of the magnetic wire and thus, its circumferential magnetization process. Exemplary GMI-based magnetic anomaly detectors that use internal biasing obtained through torsional or tensile stress applied to the magnetic wire and that are driven by AC currents in the 10 to 100 MHz range of frequency, include those taught in U.S. Pat. No. 5,994,899, issued on Nov. 30, 1999 to K. Mohri and U.S. Pat. No. 6,727,692, issued on Apr. 27, 2004 to P. Ciureanu et al. Although these GMI-based magnetic anomaly detectors provide some advantages, they are less accurate than optically pumped cesium vapor magnetometers. As will be appreciated, a GMI-based magnetic anomaly detector capable of detecting a magnetic anomaly with a spectral noise density comparable to optically pumped cesium vapor magnetometers (i.e. about $10^{-8}$ Oe/$\sqrt{Hz}$) is desired.

It is therefore an object of the present invention to provide a novel magnetic anomaly detector and method.

SUMMARY OF THE INVENTION

Accordingly, in one aspect there is provided a magnetic anomaly detector comprising an electromagnetic transmission line, at least one conductor of said transmission line being formed of a soft magnetic material.

The transmission line may be coaxial, a waveguide, a stripline or other suitable form. The soft magnetic material exhibits a large GMI effect in the operating frequency range (0.5 GHz to 10 GHz). The soft magnetic material is composed of alloys of Ni, Co, Fe and other elements such as Si, B, Mn, Cu etc. This material comes in an amorphous, nanocrystalline or polycrystalline state and is produced by sputtering, rapid solidification technology (i.e. melt spinning or casting into water), electrodeposition, rolling or other typical or non-typical method of producing metal alloys. Examples of such magnetic materials are Metglas 2714AZ, Permalloy, Finemet and MXT wires and fibers.

In one embodiment, the at least one conductor is a magnetic wire having a length less than a quarter of the wavelength of the propagating signal to inhibit the occurrence of an electrical resonance which may overlap with the ferromagnetic resonance. The magnetic wire has a saturation magnetization of about 200 kA/m (emu/cm$^3$) in order to diminish the resonant frequency and improve the resolution in frequency of the magnetic anomaly detector. The magnetic wire is formed of an amorphous alloy with the nominal composition $Ni_{45}Co_{25}Fe_6Si_9B_{13}Mn_2$ AT%, and is placed as the central conductor in a shorted coaxial transmission line whose propagating medium is air.

According to another aspect, there is provided a magnetic anomaly detector comprising a shorted coaxial transmission line comprising an outer conductor, an internal magnetic conductor exhibiting the giant magnetoimpedence effect and a dielectric interposed between said outer conductor and said magnetic conductor.

According to yet another aspect, there is provided a method of detecting a magnetic anomaly using a detector comprising an electromagnetic transmission line, at least one conductor of said transmission line comprising a soft magnetic material, said method comprising:

submitting said electromagnetic transmission line to a longitudinal static magnetic field;

simultaneously submitting said electromagnetic transmission line to an alternative magnetic field, perpendicular to said static magnetic field; and determining changes in oscillation frequency thereby to detect a magnetic anomaly.

Advantageously, the magnetic anomaly detector provides for non-invasive exploration of environmentally sensitive areas for mineral exploration and military applications. As will be appreciated, the microwave GMI effect is used to provide a magnetic anomaly detector capable of detecting a magnetic anomaly with a spectral noise density comparable to optically pumped cesium vapor magnetometers. By using sensing elements formed of soft magnetic conductors embedded in transmission lines driven in the low GHz range of frequencies and that exhibit the microwave giant magnetoimpedance effect, which involves the ferromagnetic resonance of the magnetic ions located within the skin depth of the magnetic conductors, unexpected very high magnetic field sensitivities are exhibited that are comparable to those of optically pumped cesium vapor magnetometers.

BRIEF DESCRIPTION OF THE DRAWINGS

Embodiments will now be more fully described with reference to the accompanying drawings in which.

DETAILED DESCRIPTION OF THE PREFERRED EMBODIMENTS

In the following description, a magnetic anomaly detector and method making use of the microwave GMI effect are discussed. The magnetic anomaly detector comprises at least one electromagnetic transmission line having at least one conductor acting as a sensing element comprised of a soft magnetic material. In one embodiment, the at least one conductor is an amorphous magnetic wire, 40 to 120 μm in diameter, made of a $Ni_{45}Co_{25}Fe_6Si_9B_{13}Mn_2$ or similar alloy, for a saturation magnetization of the magnetic wire of around 200 kA/m or emu/cm$^3$. This is high enough that a ferromagnetic resonance is detectable in the skin depth of the magnetic wire, but not too high, so that the resonance frequency stays in the low GHz range. This provides advantages concerning the signal to noise ratio and the resolution in frequency of the magnetic anomaly detector as will be described.

For ease of reference, the principles of ferromagnetic resonance and the microwave GMI effect will be firstly discussed with reference to FIGS. 1a and 1b. Ferromagnetic resonance (FMR) occurs in a thin soft magnetic film 10 when the magnetic film 10, of thickness t, is submitted simultaneously to a longitudinal static magnetic field, H, and to an alternating magnetic field, $h_w$, oriented along the width w of the film 10, thus perpendicular to the static magnetic field H. All of the material in the magnetic film 10 participates to the FMR. A strong absorption peak is observed at the resonant frequency, $f_0$, where the losses of the magnetic material are at a maximum. In measuring the transverse permeability $\mu_w$ of the magnetic film 10, the imaginary part of the permeability peaks, while the real part of the permeability passes through zero at this frequency. If the static magnetic field changes from H to (H+ΔH), the resonant frequency increases to ($f_0$+ Δ$f_0$).

Figure 1:
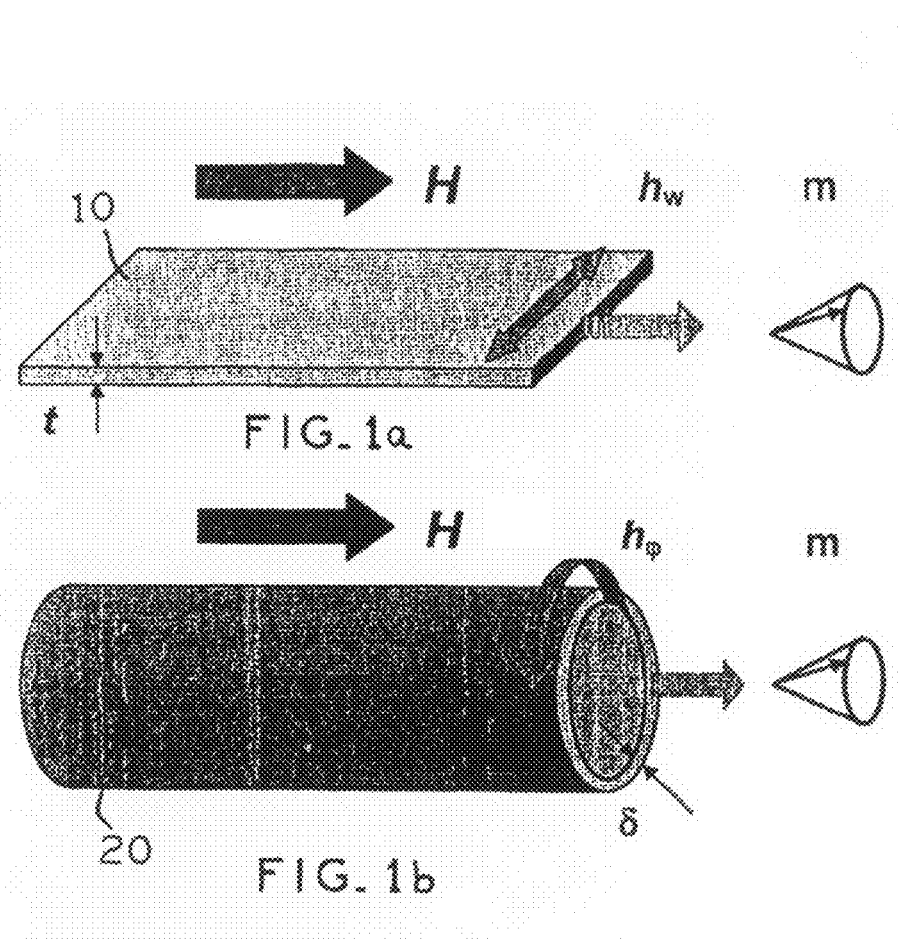
FIGS. 1a and 1b show comparatively, the spatial distribution of the magnetic fields involved in the ferromagnetic resonance occurring in a thin magnetic film and a cylindrical magnetic conductor.

FIG. 1b shows a magnetic wire 20 that forms the central conductor of a coaxial transmission line. Although not shown, the coaxial transmission line comprises an outer conductor spaced from and surrounding the magnetic wire 20. A dielectric in the form of air is interposed between the magnetic wire 20 and the outer conductor. An electromagnetic signal in the GHz range of frequency is provided at the input of the coaxial transmission line by a network analyzer or other similar electronics (not shown). The transmission line geometry favors the propagation of a transverse electromagnetic (TEM) wave along the coaxial transmission line. Such propagation is strongly influenced by a static magnetic field H applied to the coaxial transmission line 20. The electric field component of the TEM wave is radial, while the magnetic component $h_\varphi$ of the TEM wave, which is in the microwave range, is circumferential. Parts of these components penetrate the surface of the magnetic wire 20 to a depth δ given by equation (1) below:

$$\sqrt{\frac{\rho}{\pi f \mu_\varphi}} \quad (1)$$

where:
ρ is the electrical resistivity;
f is the frequency; and
$\mu_\varphi$ is the circumferential magnetic permeability of the magnetic wire.

This modifies the surface impedance of the magnetic wire 20, which is related to the magnetic wire impedance through a geometrical factor.

A static magnetic field, H, applied along the magnetic wire 20, thus perpendicular to the microwave field $h_\varphi$, excites a ferromagnetic resonance of the magnetic ions located within the skin depth δ of the magnetic wire 20 (the microwave GMI effect). The magnetic moments, m, of the ferromagnetic ions near the magnetic wire surface precess at the resonant frequency. This precession is maintained by the microwave field $h_\varphi$. The resonant frequency increases with the saturation magnetization of the magnetic wire material and the strength of the applied static magnetic field H. The losses in the magnetic wire 20 are expressed by the real part of its impedance, which shows a peak at the resonant frequency. The imaginary part of the impedance passes through zero at the same frequency. If the static magnetic field changes from H to H+ΔH, the resonant frequency increases to $f_0$+Δ$f_0$. This means that both the peak of the real part of the magnetic wire impedance and the zero crossing of the imaginary part of the magnetic wire impedance, shift on the frequency axis.

The physics of the microwave GMI effect are similar to that of the ferromagnetic resonance (FMR). The latter phenomenon occurs in transmission lines subjected simultaneously to a static magnetic field, which causes saturation of the transmission line and precession of the spins, and a perpendicular oscillating magnetic field, which provides the energy to maintain the precession and produces the resonance. In order to excite FMR, the frequency of the AC field is equal to that of the Larmor frequency of the magnetic material. This frequency increases with the saturation magnetization of the magnetic material and the strength of the applied static magnetic field. The losses induced by the FMR heat the magnetic material. The imaginary part of the permeability of this magnetic material shows a peak while the real part passes through zero at the resonant frequency.

Figure 2:
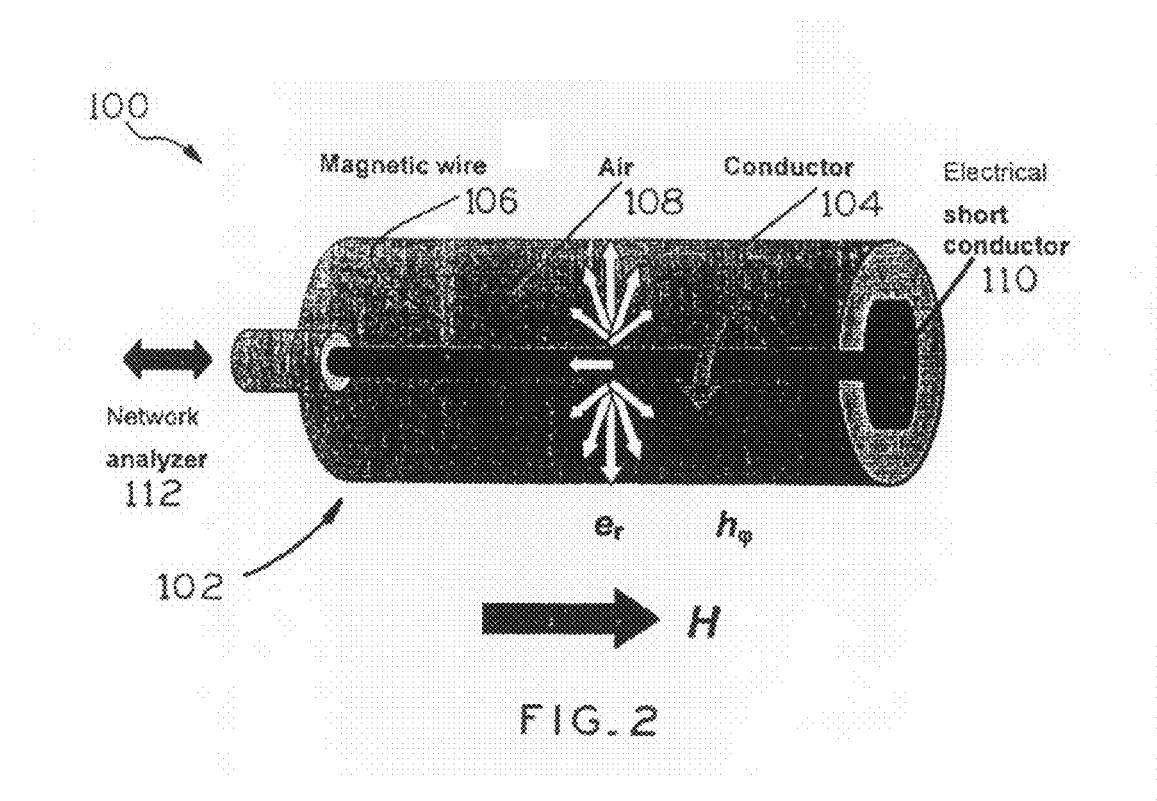
FIG. 2 is a simplified drawing of a magnetic anomaly detector comprising a coaxial transmission line exhibiting the microwave giant magnetoimpedance effect.

Turning now to FIG. 2 a magnetic anomaly detector using the microwave GMI effect is shown and is generally identified by reference numeral 100. As can be seen, magnetic anomaly detector 100 comprises a coaxial transmission line 102 to which a TEM electromagnetic wave and a static magnetic field H are applied. The coaxial transmission line 102 has an outer, tubular, non-magnetic metal conductor 104 with large electrical conductivity, surrounding a central, soft magnetic wire 106 exhibiting a large microwave GMI effect in the operating frequency range of the magnetic anomaly detector 100 i.e. in the frequency range of from about 0.5 GHz to about 20 GHz. The size and shape of the magnetic wire 106 is selected to provide adequate impedance matching within the operating frequency range. An air gap 108 is provided between the outer conductor 104 and the magnetic wire 106 and acts as a dielectric. A conductive metal disc 110 is provided at one end of the magnetic wire 106. The disc 110 spans the air gap 108 and contacts the outer conductor 104 to provide an electrical short between the magnetic wire 106 and the outer conductor 104. Shorting the magnetic wire 106 and the outer conductor 104 increases the signal-to-noise ratio of the magnetic anomaly detector 100 as the propagating TEM electromagnetic wave travels twice the length of the transmission line 102.

The soft magnetic wire is composed of alloys of Ni, Co and Fe and other elements such as Si, B, Mn, Cu etc. In this particular embodiment, the soft magnetic wire 106 is composed of a $Ni_{45}Co_{25}Fe_6Si_9B_{13}Mn_2$ alloy. The material used to form the alloy from which the magnetic wire 106 is created, may be amorphous, nanocrystalline or polycrystalline. The amorphous, nanocrystalline or polycrystalline material is processed using sputtering, rapid solidification technology i.e. melt spinning or casting into water, electrodeposition, rolling or other techniques to form the alloy. The magnetic wire 106 has a saturation magnetization of about 200 kA/m ($emu/cm^3$) and a diameter in the range of 40 to 120 μm. The length of the magnetic wire 106 is selected to be less than a quarter of the wavelength of the propagating TEM electromagnetic signal to inhibit the occurrence of an electrical resonance which may overlap with the TEM electromagnetic ferromagnetic resonance.

During operation of the magnetic anomaly detector 100, the TEM electromagnetic wave, whose electric field component $e_r$ is radial and magnetic field component $h_\phi$ is circumferential, is applied to the transmission line 102 using a network analyzer 112 and propagates through the transmission line 102. The power of the TEM electromagnetic signal generated by the network analyzer 112 at the transmission input of the line should be around 1 mW in order to avoid non-linear effects. The frequency of the TEM electromagnetic wave is selected so that the frequency of the magnetic field $h_\phi$ is in the operating range of the natural ferromagnetic resonance of the magnetic wire material. The magnetic field $h_\phi$ is also modulated in amplitude, frequency or phase. As discussed above, parts of the TEM electromagnetic wave components penetrate the surface of the magnetic wire 106 to the skin depth δ, defined previously. This modifies the impedance of the magnetic wire 106.

The static magnetic field, H, is also applied to the magnetic wire 106. The static magnetic field H, which is perpendicular to the magnetic field $h_\phi$ along the magnetic wire 106, excites a ferromagnetic resonance of the magnetic ions located within the skin depth of the magnetic wire 106. The static magnetic field H is applied using electromagnetic coils or permanent magnets and is modulated in amplitude, frequency or phase. For example, the static magnetic field H may be ramp, sawtooth, sinusoidal or pulse modulated. The amplitude of the static magnetic field H determines the resonant frequency of the magnetic wire 106 in the operating frequency range of the magnetic anomaly detector 100 while the magnetic field $h_\phi$ provides the energy for precession at resonance.

The resonant frequency increases with the saturation magnetization of the magnetic wire material and the strength of the applied magnetic field H. The losses in the magnetic wire 106 are expressed by the real part of its impedance, which shows a peak at the resonant frequency. The imaginary part of the impedance passes through zero at the same frequency. These two parts are calculated by measuring the reflection coefficient, $s_{11}$, of the transmission line 102 using the network analyzer 112. The change in resonant frequency is measured using standard techniques either in the frequency or time domain thereby to detect magnetic anomalies.

The input impedance of the transmission line 102 is calculated from the complex reflection coefficient for a given frequency and field. The characteristic impedance, $Z_c$ of the transmission line 102 and longitudinal propagation coefficient, Γ, of the TEM mode are deduced from the input impedance. The lumped parameters of the transmission line 102 are calculated using the impedance $Z_c$ and propagation coefficient Γ. The external inductance due to the line transmission is subtracted from the total inductance, yielding the intrinsic inductance of the magnetic wire 106, while the resistance of the external conductor 104 and the conductance of air 108 are negligible compared to those induced by the high permeability and resistivity of the magnetic wire 106. The impedance spectra of the magnetic wire 106 is measured by sweeping the frequency of the input TEM electromagnetic signal in the static magnetic field.

Figure 3:
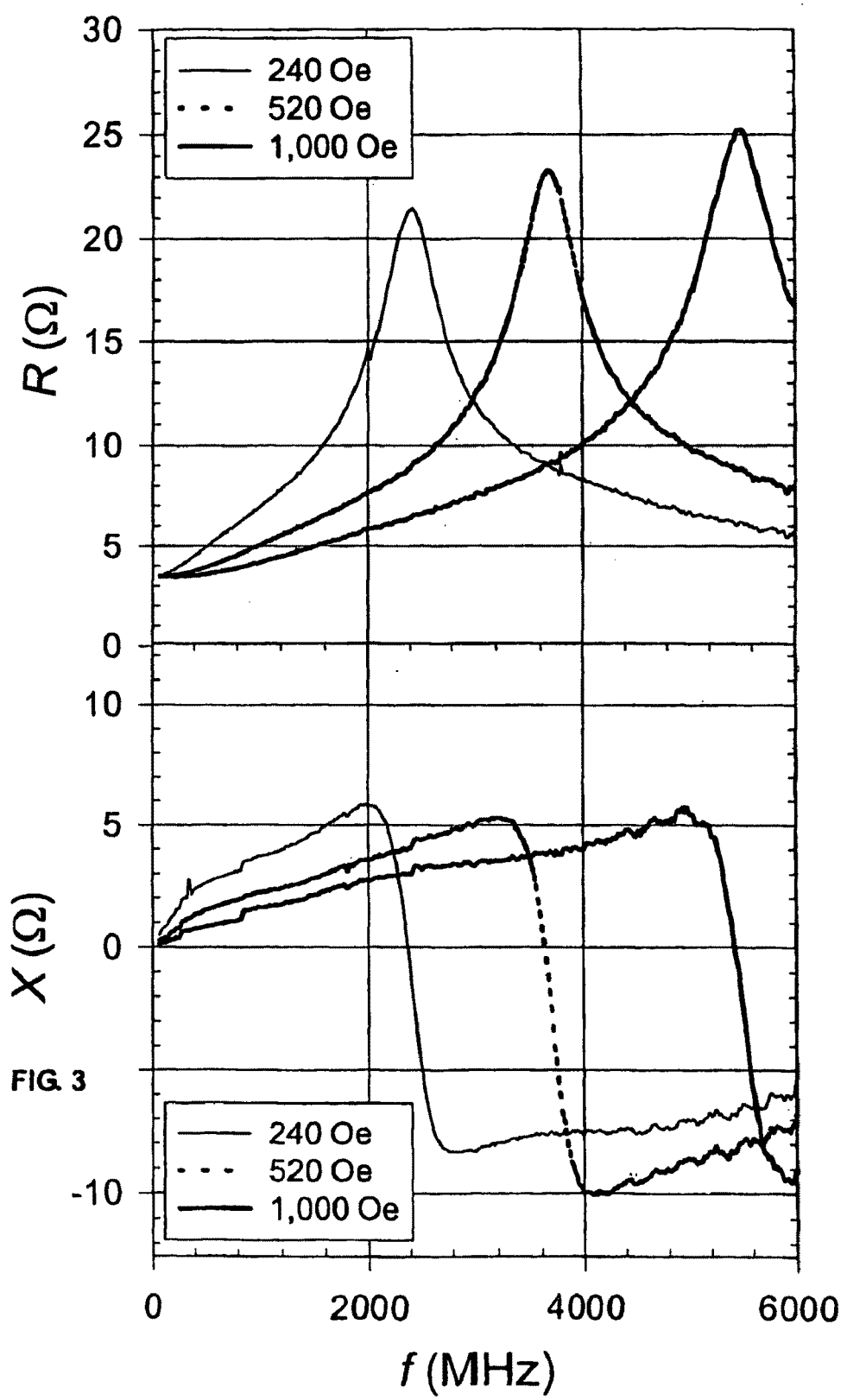
FIG. 3 shows the variations with frequency of the real and imaginary parts of the impedance of a $Ni_{45}Co_{25}Fe_6Si_9B_{13}Mn_2$ magnetic wire for static magnetic fields of 240, 520 and 1,000 Oe respectively, forming part of the coaxial transmission line of FIG. 2.

FIG. 3 shows the frequency spectra of the real part, R, and the imaginary part, X, of the impedance of a $Ni_{45}Co_{25}Fe_6Si_9B_{13}Mn_2$ magnetic wire for three static magnetic fields. The frequency is swept from 30 MHz to 6 GHz, while static magnetic fields of 240, 520 and 1,000 Oe are applied along the transmission line 102.

The resonant frequency, $f_0$, is the frequency value at which the real part R peaks and the imaginary part X is null. At a static magnetic field of 240 Oe, $f_0$=2.4787 GHz, the resonant frequency increases up to 5.4 GHz for a static magnetic field of 1 kOe. The importance of keeping this frequency as small as possible is illustrated by a simple calculation. The Earth's magnetic field is about 0.25 Oe. For example in the case of a magnetic anomaly that amounts to 0.02 Oe, if this amount is added to the 240 Oe static magnetic field, the result H+ΔH is 240.02 Oe. Using Kittel's equation for the ferromagnetic resonance frequency as represented by equation (2) below:

$$f_0^2 = \left(\frac{\gamma\mu_0}{2\pi}\right)^2 H(H + M_s) \quad (2)$$

where:

γ is the gyromagnetic ratio of the electron;

$\mu_0$ is the permeability of the air; and $M_s$ the saturation magnetization of the magnetic alloy, yields a frequency change $\Delta f_0$ equal to 103.2 kHz resulting in a reasonably high frequency resolution of the magnetic anomaly detector, $\Delta f_0/f_0$ equal to 41.66 $10^{-6}$, or 41.66 ppm.

Figure 4:
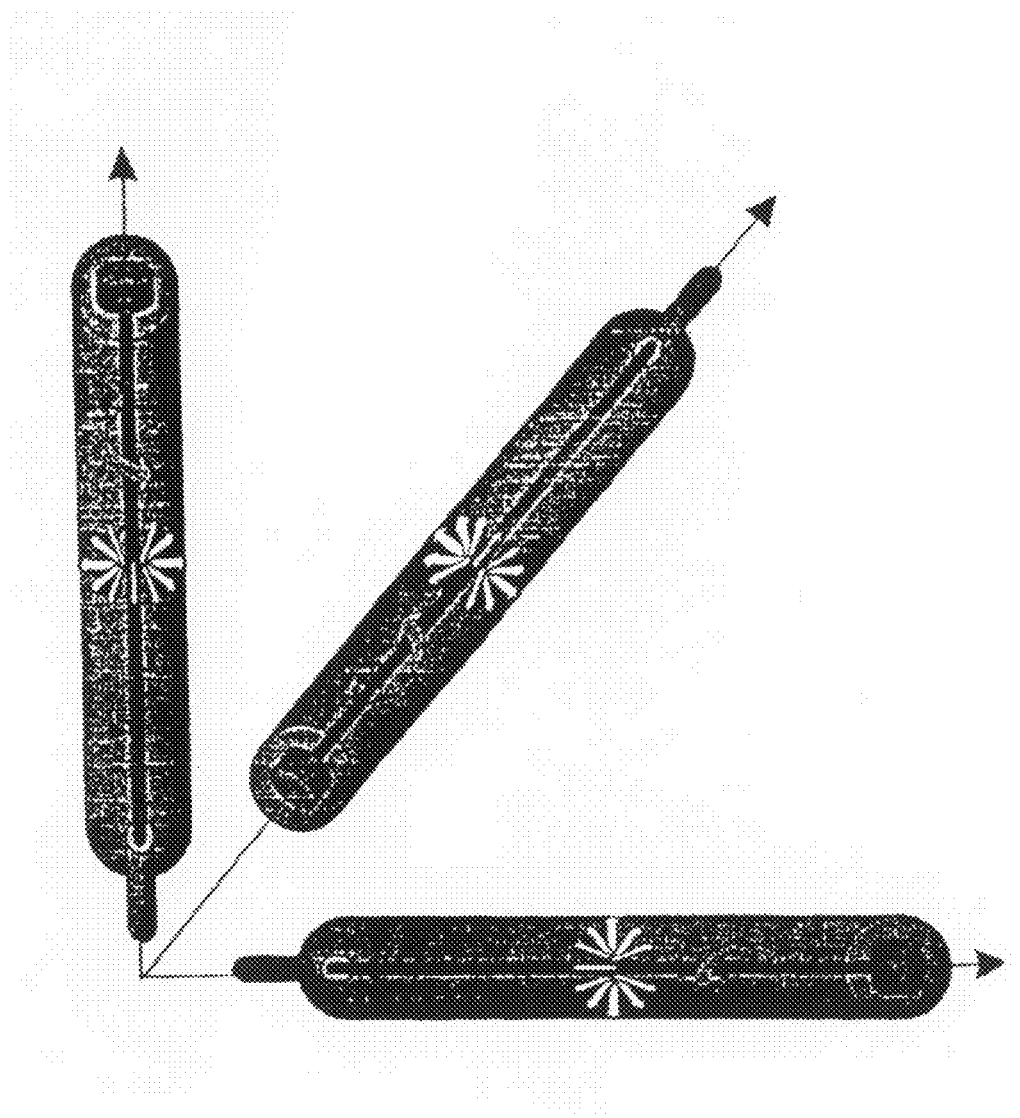
FIG. 4 is a three-dimensional arrangement of coaxial transmission lines of the type shown in FIG. 2.

Although the above embodiment shows a magnetic anomaly detector comprising a single coaxial transmission line, the magnetic anomaly detector may in fact comprise an array of coaxial transmission lines. For example, turning to FIG. 4, a magnetic anomaly detector comprising three coaxial transmission lines is shown. As can be seen, in this embodiment, the coaxial transmission lines are mounted in an orthogonal (triaxial) configuration. This arrangement of coaxial transmission lines is advantageous in that the vector components of the magnetic anomaly can be detected, which helps to spatially locate the source of the magnetic anomaly.

Figure 5:
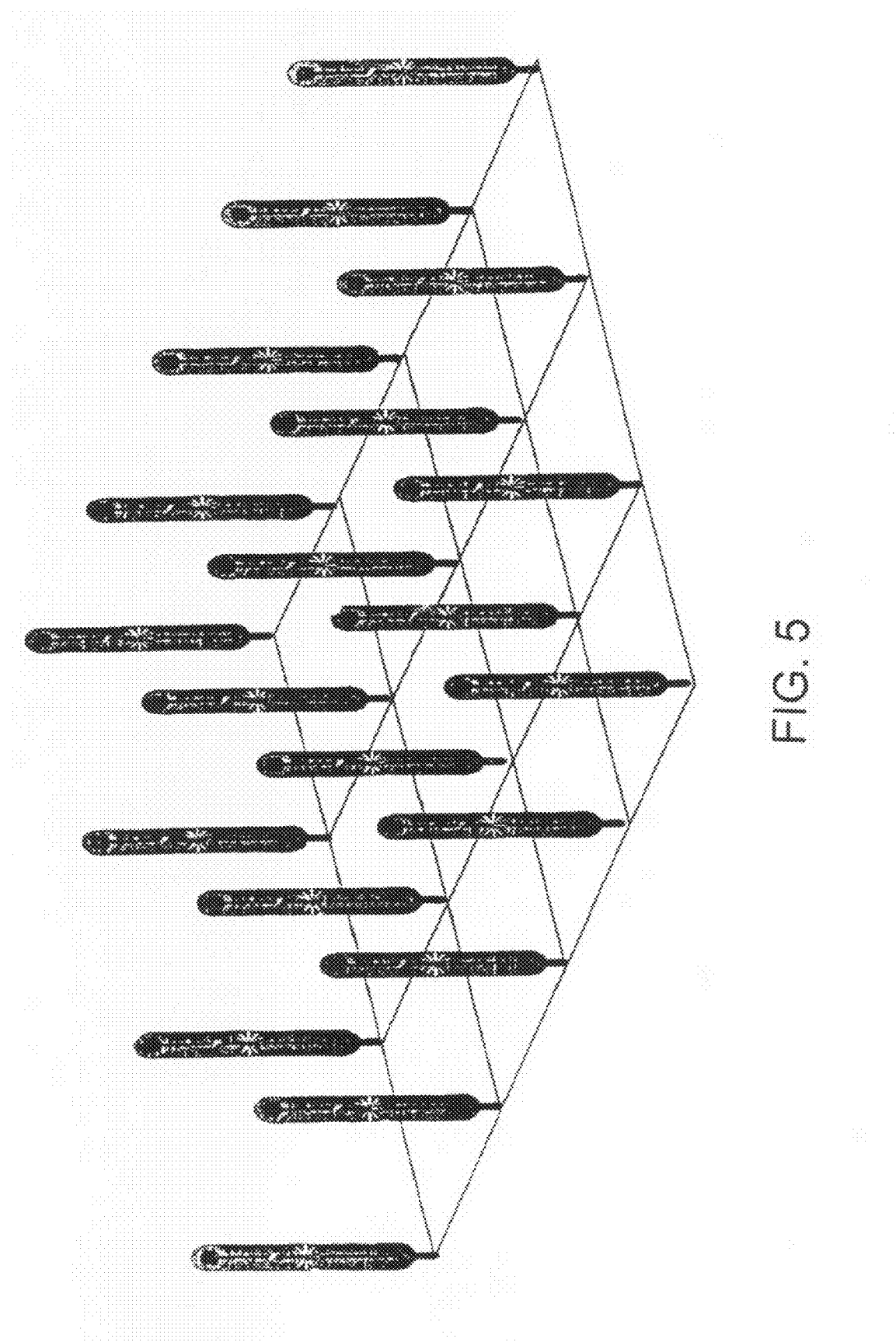
FIG. 5 is an array of coaxial transmission lines of the type shown in FIG. 2.

FIG. 5 shows yet another magnetic anomaly detector. In this embodiment, the magnetic anomaly detector comprises a four by five array of parallel, coaxial transmission lines. Of course larger or smaller arrays of transmission lines can be used.

In the above embodiments, the magnetic anomaly detector is described and shown as a coaxial transmission line. Those of skill in the art will however appreciate that the magnetic anomaly detector may take other forms. For example, the transmission line may be in the form of a waveguide or stripline with the magnetic conductor being a ribbon, thin film or thick film.

Although particular embodiments have been described and illustrated, those of skill in the art will appreciate that variations and modifications may be made without departing from the sphere and scope of the present invention as defined by the appended claims.

What is claimed is:

1. A magnetic anomaly detector comprising an electromagnetic transmission line, at least one conductor of said transmission line being formed of a soft magnetic material, wherein said transmission line is coaxial and comprises an outer conductor surrounding a central conductor formed of said soft magnetic material and spaced therefrom by a dielectric, said central conductor and outer conductor being electrically shorted.

2. The magnetic anomaly detector of claim 1, wherein said dielectric is air.

3. The magnetic anomaly detector of claim 1, wherein said central conductor is a magnetic wire having a diameter between about 40 μm and 120 μm.

4. The magnetic anomaly detector of claim 1, wherein said transmission line has a length of less than one quarter of the wavelength of an electromagnetic wave applied to said transmission line.

5. The magnetic anomaly detector of claim 4, wherein said central conductor has a saturation magnetization that is high enough for detection of ferromagnetic resonance in the skin depth thereof while maintaining resonance frequency in the low gigahertz range.

6. The magnetic anomaly detector of claim 4, wherein said central conductor has a saturation magnetization of about 200 kA/m.

7. The magnetic anomaly detector of claim 4, wherein central conductor is formed of an amorphous alloy.

8. The magnetic anomaly detector of claim 7 wherein said alloy is a $Ni_{45}Co_{25}Fe_6Si_9B_{13}Mn_2$ alloy.

9. The magnetic anomaly detector of claim 4, wherein said dielectric is air.

10. A magnetic anomaly detector comprising a shorted coaxial transmission line comprising an outer conductor, an internal magnetic conductor exhibiting the giant magnetoimpedence effect and a dielectric interposed between said outer conductor and said magnetic conductor.

11. The magnetic anomaly detector of claim 10, wherein said outer conductor is formed of a non-magnetic metal having a high electrical conductivity.

12. The magnetic anomaly detector of claim 11 wherein said magnetic conductor is a wire having a length of less than one quarter of a wavelength of an applied electromagnetic wave.

13. The magnetic anomaly detector of claim 12, wherein said wire has a saturation magnetization that is high enough for detection of ferromagnetic resonance in the skin depth of the wire while maintaining resonance frequency in the low gigahertz range.

14. The magnetic anomaly detector of claim 12 wherein said wire has a saturation magnetization of about 200 kA/m.

15. The magnetic anomaly detector of claim 12 wherein said wire is formed of an amorphous alloy.

16. The magnetic anomaly detector of claim 15 wherein said alloy is a $Ni_{45}Co_{25}Fe_6Si_9B_{13}Mn_2$ alloy.

17. The magnetic anomaly detector of claim 12 wherein said dielectric is air.

18. A method of detecting a magnetic anomaly using a detector comprising an electromagnetic transmission line, at least one conductor of said transmission line comprising a soft magnetic material, said method comprising:
submitting said electromagnetic transmission line to a longitudinal static magnetic field;
simultaneously submitting said electromagnetic transmission line to an alternative magnetic field, perpendicular to said static magnetic field; and
determining changes in oscillation frequency thereby to detect a magnetic anomaly.

* * * * *